(12) United States Patent
Tong et al.

(10) Patent No.: US 6,617,237 B1
(45) Date of Patent: Sep. 9, 2003

(54) LEAD-FREE BUMP FABRICATION PROCESS

(75) Inventors: Ho-Ming Tong, Taipei (TW);
Chun-Chi Lee, Kaohsiung (TW);
Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung (TW); Tsung-Hua Wu, Kaohsiung Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,882

(22) Filed: Feb. 27, 2003

(30) Foreign Application Priority Data

Feb. 27, 2002 (TW) ............................... 91103532

(51) Int. Cl.⁷ .................... H01L 21/44; H01L 21/4763
(52) U.S. Cl. ................... 438/613; 438/614; 438/615
(58) Field of Search ..................... 438/612–618

(56) References Cited

U.S. PATENT DOCUMENTS 6,281,581 B1 * 8/2001 Desai et al.
6,380,060 B1 * 4/2002 Zohni
6,413,851 B1 * 7/2002 Chow et al.
6,492,252 B1 * 12/2002 Lin et al.

FOREIGN PATENT DOCUMENTS

EP            629464 A1 * 12/1994

OTHER PUBLICATIONS

Joshi et al., US patent application Publication 2002/0192935A1, Dec. 2002.*

* cited by examiner

Primary Examiner—Ha Tran Nguyen
(74) Attorney, Agent, or Firm—Jiang Chyun IP Office

(57) ABSTRACT

A lead-free solder bump fabrication process for producing a plurality of lead-free solder bumps over a wafer is provided. The lead-free solder bump fabrication process includes forming a lead-free pre-formed solder bump over each bonding pad on the wafer and then forming a patterned solder mask layer over the active surface of the wafer. The openings in the solder mask layer expose the respective lead-free pre-formed solder bumps on the wafer. Thereafter, lead-free solder material is deposited into the opening. The material composition of the lead-free solder material differs from the material composition of the lead-free pre-formed solder bump. A reflow process is conducted so that the lead-free pre-formed solder bump fuses with the lead-free solder material to form a lead-free solder bump. Finally, the solder mask layer is removed.

25 Claims, 2 Drawing Sheets

LEAD-FREE BUMP FABRICATION PROCESS

CROSS REFERENCE TO RELATED APPLICATIONS

This application claims the priority benefit of Taiwan application serial No. 91103532, filed Feb. 27, 2002.

BACKGROUND OF INVENTION

1. Field of Invention

The present invention relates to a bump fabrication process. More particularly, the present invention relates to a process for fabricating lead-free bumps over a wafer.

2. Description of Related Art

In the fabrication of integrated circuit packages, a chip is linked to a carrier inside a first level package in one of three ways including wire bonding, tape automatic bonding (TAB) and flip chip (F/C). In a tape automatic bonding or a flip chip package, the process of linking up the chip and the carrier involves the production of bumps on the bonding pads of the chip. In fact, the bump serves as an electrical medium for connecting the chip and the carrier. A variety of types of bumps have been developed such as solder bumps, gold bumps, conductive polymer bumps and polymer bumps. However, solder bumps are the most popular type.

A conventional method of fabricating a solder bump involves forming an under-ball-metallurgy (UBM) layer over the bonding pad of a wafer by evaporation, sputtering or electroplating. Thereafter, a thick photoresist layer is formed over the wafer. Through a plurality of openings that exposes the under-ball-metallurgy layer, solder material is deposited into the opening by evaporation, electroplating or printing. Finally, a reflow process is conducted fusing the solder material together to form a solder bump having a spherical external appearance.

Lead-tin alloy (Sn-Pb alloy) is a material having ideal physical and conductive properties for forming solder bump aside from forming connections between devices or circuit boards. However, lead is an environmentally hazardous material that may affect the health of people. Hence, the electronic industry has been actively searching for lead-free solder alloy material to replace conventional lead-tin alloy material.

Most lead-free alloy contains tin and (one or more) other metallic elements. Common metallic elements other than tin to be used inside a lead-free alloy include gold (Au), silver (Ag), copper (Cu), magnesium (Mg), bismuth (Bi), antimony (Sb), indium (In) and zinc (Zn). Aside from lead-free solder alloy containing tin, lead-free solder alloy may contain no tin. In other words, lead-free solder alloy also includes solder material that has no traces of tin. Similarly, a lead-free solder refers to a solder material containing no traces of lead only and may or may not contain any tin. In a conventional lead-free solder bump fabrication process, metallic elements in a specified ratio are used to produce an alloy of lead-free solder material. This lead-free solder material is deposited over a wafer and then a reflow process is carried out to form a lead-free solder bump.

SUMMARY OF INVENTION

Accordingly, one object of the present invention is to provide a lead-free solder bump fabrication process that includes forming a lead-free pre-formed solder bump over a wafer, depositing solder material on the lead-free solder bump and conducting a reflow process to form a lead-free solder bump. Since the lead-free pre-formed solder bump and the lead-free solder material may contain different constituents and may be composed of a single metal or an alloy of metals, ultimate composition of the lead-free solder bump can be easily adjusted.

To achieve these and other advantages and in accordance with the purpose of the invention, as embodied and broadly described herein, the invention provides a lead-free solder bump fabrication process for forming a plurality of lead-free solder bumps over a wafer. The wafer has an active surface with a passivation layer and a plurality of bonding pads thereon. The passivation layer exposes the bonding pads. First, an under-ball-metallurgy layer is formed over the bonding pads. A lead-free pre-formed solder bump is formed over each under-ball-metallurgy layer. Thereafter, a patterned solder mask is formed over the active surface of the wafer. The solder mask layer has a plurality of openings that exposes the respective lead-free pre-formed solder bumps. A lead-free solder material is deposited into the openings. The lead-free solder material may contain constituents that differ from the lead-free pre-formed solder bump. A reflow process is conducted so that the lead-free pre-formed solder bump and the lead-free solder material may fuse together to produce a lead-free solder bump. Finally, the solder mask layer is removed.

The lead-free solder bump fabrication process according to this invention includes forming an under-ball-metallurgy layer over the bonding pads of a wafer and forming a lead-free pre-formed solder bump over the under-ball-metallurgy layers. Thereafter, a patterned solder mask layer having a plurality of openings that exposes the lead-free pre-formed solder bumps is formed over the wafer. Lead-free solder material is deposited into the openings stacking on top of the lead-free pre-formed solder bump. A reflow process is carried out so that the lead-free pre-formed solder bump and the lead-free solder material are fused together to produce a lead-free solder bump. Finally, the solder mask layer is removed. Because the lead-free pre-formed solder bump and the lead-free solder material may be fabricated using different constituents, composition of the lead-free solder bump can be easily adjusted.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
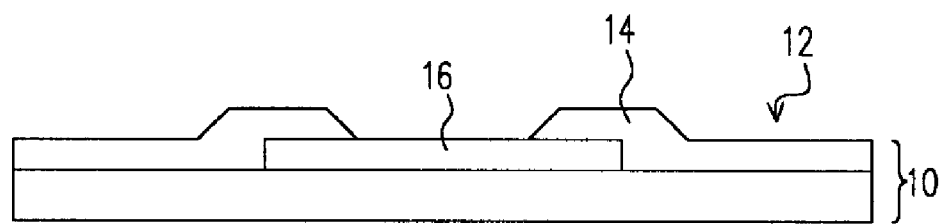
FIGS. 1 to 6 are schematic cross-sectional views showing the steps carried out in a lead-free solder bump fabrication process according to a preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 to 6 are schematic cross-sectional views showing the steps carried out in a lead-free solder bump fabrication process according to a preferred embodiment of this invention. As shown in FIG. 1, a wafer 10 having an active surface 12, a passivation layer 14 and a plurality of bonding pads 16 (only one is shown) is provided. The passivation layer 14 and the bonding pads 16 are formed on the active surface 12 of the wafer 10. The passivation layer 14 exposes various bonding pads 16 on top of the wafer 10.

Figure 2:
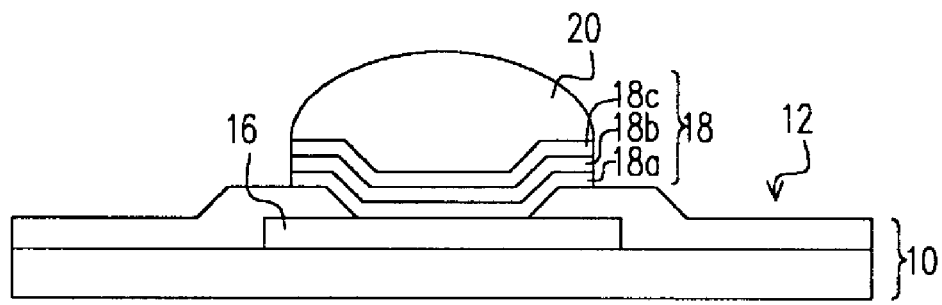

As shown in FIG. 2, an under-ball-metallic (UBM) layer 18 is formed over each bonding pad 16. The under-ball-metallurgy layer 18 is a stack of material layers that includes an adhesion layer 18a, a barrier layer 18b and a wetting layer 18c. The bottom-most adhesion layer 18a is fabricated from a material such as aluminum (Al), titanium (Ti), titanium-tungsten (TiW) alloy or chromium (Cr). The barrier layer 18b in the middle is fabricated using a material such as nickel (Ni), vanadium (V), chromium (Cr) or copper (Cu). The top-most wetting layer 18c is fabricated using a material such as copper (Cu), gold (Au), silver (Ag) or palladium (Pd). Thereafter, a lead-free pre-formed solder bump 20 is formed over the under-ball-metallurgy layer 18 above each bonding pad 16. Due to a reflow treatment, the pre-formed solder bump 20 has a hemispherical shape. The lead-free pre-formed solder bump 20 can be fabricated using a single metal or an alloy of metals.

Figure 3:
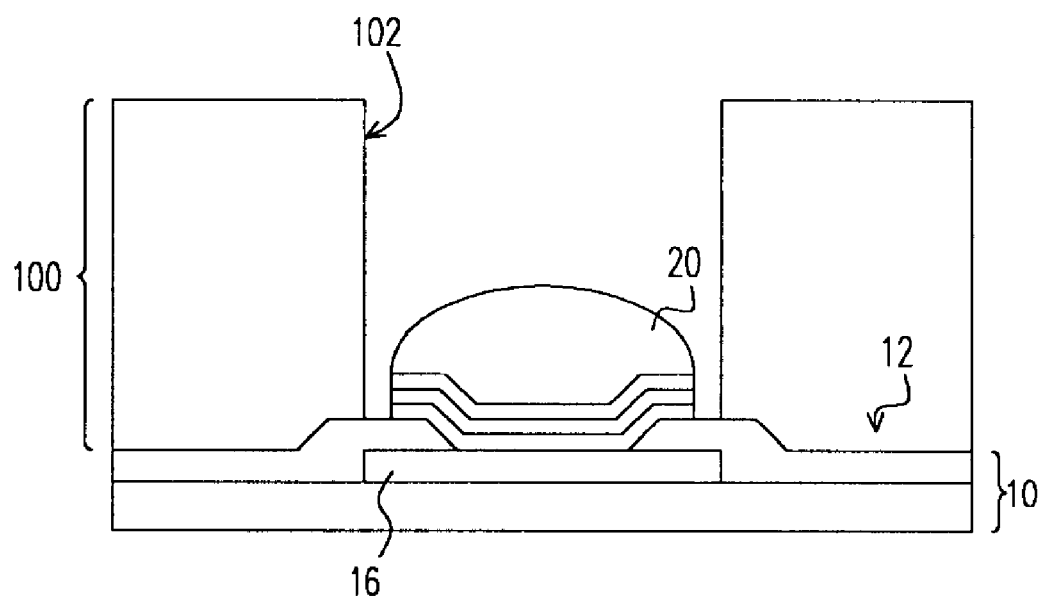

As shown in FIG. 3, a patterned solder mask layer 100 is formed over the active surface 12 of the wafer 10. The solder mask layer 100 has a plurality of openings (only one is shown) 102 for exposing the lead-free pre-formed solder bumps 20 on the wafer 10. A first method of forming the patterned solder mask layer 100 is to print solder mask material directly over the wafer 10. Alternatively, a patterned photoresist layer (not shown) is formed over the active surface 12 of the wafer 10 before filling the photoresist free region with solder mask material in a printing process and then removing the patterned photoresist to expose the patterned solder mask layer 100. A second method of forming the patterned solder mask layer 100 includes coating a photosensitive solder mask material over the active surface 12 of the wafer globally and then a photo-via method is used to form openings 102 in the solder mask layer 100. The openings 102 in the solder mask layer 100 expose the lead-free pre-formed solder bump 20 over the wafer 10. The sidewalls of each opening 102 and the upper surface of the lead-free pre-formed solder bump 20 together form a cavity capable of holding some lead-free solder material 104 (as shown in FIG. 4).

Figure 4:
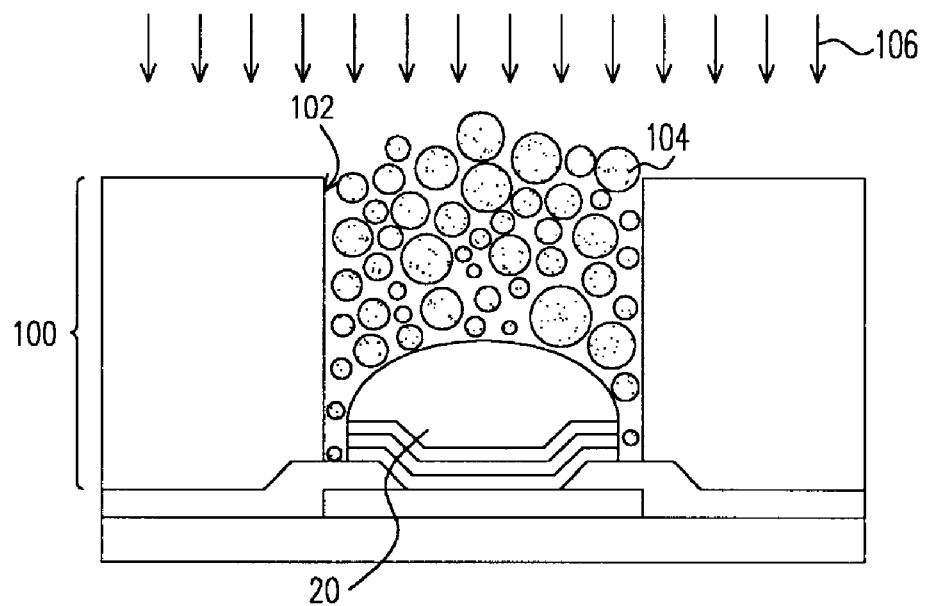

As shown in FIG. 4, lead-free solder material 104 is deposited into the opening 102 above the lead-free pre-formed solder bump 20 in a printing or some other process. The lead-free solder material 104 may differ in composition to the lead-free pre-formed solder bump 20. In addition, the lead-free solder material 104 may contain a single metallic constituent or an alloy of metallic constituents in solder power or solder paste form.

Figure 5:
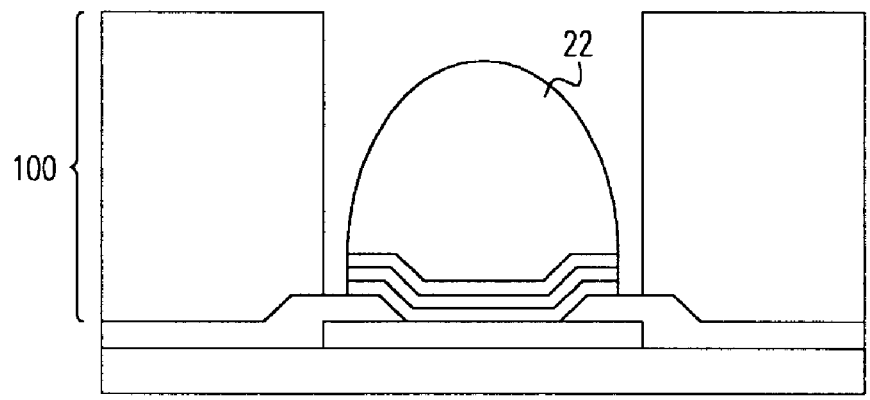

As shown in FIGS. 4 and 5, flux 106 is sprayed onto the solder material 104 during a reflow process. The flux 106 facilitates the fusion between the lead-free solder material 104 and the lead-free pre-formed solder bump 20 into a lead-free solder bump 22. To form a really spherical lead-free solder bump 22, some flux 106 may be added and mixed with the lead-free solder material 104 prior to depositing the mixed material into the opening 102. Thereafter, a first reflow process is carried out so that the lead-free solder material 104 fuses with the lead-free pre-formed solder bump 20 to form a preliminary solder bump mass 22. Since shape of the preliminary solder bump mass 22 may not be too spherical, flux 106 is again sprayed onto the preliminary solder bump mass 22 and then a second reflow process is carried out to form a highly spherical lead-free solder bump 22 as shown in FIG. 5.

Figure 6:
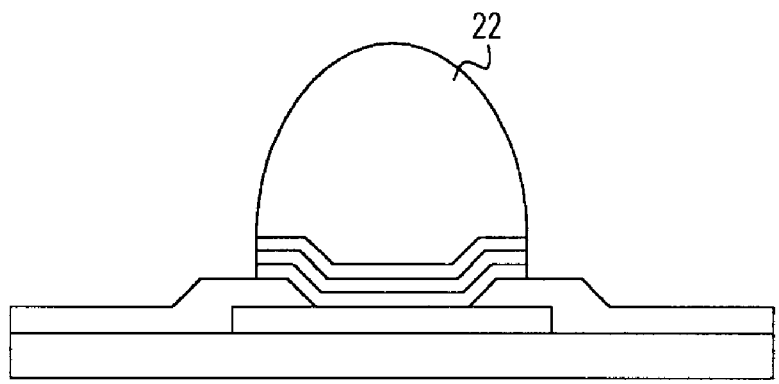

As shown in FIGS. 4 and 5, a reflow process is carried out after lead-free solder material 104 is deposited into the opening 102. The lead-free pre-formed solder bump 20 and the solder material 104 fuse together to form a lead-free solder bump 22 as shown in FIG. 5. Finally, as shown in FIG. 6, the solder mask layer 100 as shown in FIG. 5 is removed so that the lead-free solder bump 22 is exposed above the wafer 10.

The lead-free solder material 104 is a binary, tertiary or quaternary alloy of the metallic elements including tin, gold, silver, copper, magnesium, bismuth, antimony, indium and zinc. Since various metallic elements can be combined in different proportions, a countless variety of lead-free solder alloy material can be fabricated. Furthermore, each material composition will produce a lead-free alloy material having a specific physical and electrical properties. Hence, the material constituting the ultimately formed lead-free solder bump can be identified by a natural number N for the number of metallic elements in the alloy. Here, N is any natural number greater than 1. In the embodiment of this invention, material composition of the lead-free solder bump 22 is set prior to adjusting the material composition of the lead-free pre-formed solder bump 20 and the lead-free solder material 104 so that the ultimately formed lead-free solder bump 22 can have the desired composition.

In summary, the steps for forming lead-free solder bumps over a wafer according to this invention include forming lead-free pre-formed solder bumps over the respective bonding pads on the active surface of a wafer and then forming a patterned solder mask layer over the wafer. The solder mask layer has a plurality of openings that exposes the respective lead-free pre-formed solder bumps. Thereafter, lead-free solder material is deposited into the opening over the lead-free pre-formed solder bump. The lead-free pre-formed solder bump and the lead-free solder material are fused together to form a lead-free solder bump by conducting a reflow process. Since material composition of the lead-free pre-formed solder bump and the lead-free solder material can be adjusted independently, a lead-free solder bump having a variety of material composition can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lead-free solder bump fabrication process for producing at least one lead-free solder bump on a wafer, wherein the wafer has an active surface, a passivation layer and at least one bonding pad, and the bonding pad is on the active surface of the wafer and the passivation layer exposes the bonding pad, the lead-free solder bump fabrication process comprising the steps of:

forming an under-ball-metallurgy layer over the bonding pad;

forming a lead-free pre-formed solder bump over the under-ball-metallurgy layer;

forming a patterned solder mask layer over the active surface of the wafer, wherein the solder mask layer has at least an opening that exposes the lead-free pre-formed solder bump;

depositing lead-free solder material into the opening, wherein the material composition of the lead-free solder material differs from the material composition of the lead-free pre-formed solder bump;

conducting a reflow process so that the lead-free pre-formed solder bump and the lead-free solder material fuse together to form a lead-free solder bump; and removing the solder mask layer.

2. The process of claim 1, wherein material forming the top-most layer of the under-ball-metallurgy layer is selected from a group of metals consisting of copper, gold, silver and palladium.

3. The process of claim 1, wherein the lead-free pre-formed solder bump is fabricated using either a single metal other than lead or a lead-free alloy of metals.

4. The process of claim 1, wherein the lead-free solder material is fabricated using either a single metal other than lead or a lead-free alloy of metals.

5. The process of claim 1, wherein the lead-free solder bump is fabricated using an alloy of N metals where N is a natural number greater than one.

6. The process of claim 1, wherein the melting point of the lead-free pre-formed solder bump is lower than the lead-free solder material.

7. The process of claim 1, wherein material constituting the lead-free pre-formed solder bump is selected from a group of metallic elements consisting of tin, gold, silver, copper, magnesium, bismuth, antimony, indium and zinc or an alloy of the aforementioned metals.

8. The process of claim 1, wherein the material constituting the lead-free solder material is selected from a group of metallic elements consisting of tin, gold, silver, copper, magnesium, bismuth, antimony, indium and zinc or an alloy of the aforementioned metals.

9. The process of claim 7, wherein the lead-free pre-formed solder bump or the lead-free solder material contains tin.

10. The process of claim 1, wherein the lead-free solder material is in either power or paste form.

11. The process of claim 1, wherein the step of forming the patterned solder mask layer includes printing.

12. The process of claim 1, wherein the step of forming the patterned solder mask layer includes coating a solder mask material over the wafer globally and then forming an opening in the solder mask material layer.

13. The process of claim 12, wherein the step of forming the opening includes conducting a photo-via process.

14. The process of claim 1, wherein before the step of forming the lead-free pre-formed solder bump, further includes forming an under-ball-metallurgy layer over the bonding pad so that the lead-free pre-formed solder bump is formed over the under-ball-metallurgy layer.

15. A lead-free solder bump fabrication process for producing at least one lead-free solder bump on a wafer, wherein the wafer has an active surface and at least one lead-free pre-formed solder bump on the active surface of the wafer, the lead-free solder bump fabrication process comprising the steps of:

forming a patterned solder mask layer over the active surface of the wafer, wherein the solder mask layer has at least an opening that exposes the lead-free pre-formed solder bump;

depositing lead-free solder material into the opening, wherein the material composition of the lead-free solder material differs from the material composition of the lead-free pre-formed solder bump;

conducting a reflow process so that the lead-free pre-formed solder bump and the lead-free solder material fuse together to form a lead-free solder bump; and removing the solder mask layer.

16. The process of claim 15, wherein the lead-free pre-formed solder bump is fabricated using either a single metal or an alloy of metals.

17. The process of claim 15, wherein the lead-free solder material is fabricated using either a single metal or an alloy of metals.

18. The process of claim 15, wherein the lead-free solder bump is fabricated using an alloy of N metals where N is a natural number greater than one.

19. The process of claim 15, wherein material constituting the lead-free pre-formed solder bump is selected from a group of metallic elements consisting of tin, gold, silver, copper, magnesium, bismuth, antimony, indium and zinc or an alloy of the aforementioned metals.

20. The process of claim 15, wherein the material constituting the lead-free solder material is selected from a group of metallic elements consisting of tin, gold, silver, copper, magnesium, bismuth, antimony, indium and zinc or an alloy of the aforementioned metals.

21. The process of claim 15, wherein the lead-free pre-formed solder bump or the lead-free solder material contains tin.

22. The process of claim 15, wherein the lead-free solder material is in either powder or paste form.

23. The process of claim 15, wherein the step of forming the patterned solder mask layer includes printing.

24. The process of claim 15, wherein the step of forming the patterned solder mask layer includes coating a solder mask material over the wafer globally and then forming an opening in the solder mask material layer.

25. The process of claim 24, wherein the step of forming the opening includes conducting a photo-via process.

* * * * *